(12) United States Patent
Zhang

(10) Patent No.: US 8,502,575 B2
(45) Date of Patent: Aug. 6, 2013

(54) FRACTIONAL-N PLL USING MULTIPLE PHASE COMPARISON FREQUENCIES TO IMPROVE SPURIOUS SIGNAL PERFORMANCE

(75) Inventor: Benyong Zhang, Auburn, WA (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 13/242,590

(22) Filed: Sep. 23, 2011

(65) Prior Publication Data

US 2012/0074995 A1 Mar. 29, 2012

Related U.S. Application Data

(60) Provisional application No. 61/387,197, filed on Sep. 28, 2010.

(51) Int. Cl.
*H03L 7/06* (2006.01)
(52) U.S. Cl.
USPC ........................................... 327/156; 327/147
(58) Field of Classification Search
USPC .................................................. 327/147, 156
See application file for complete search history.

(56) References Cited

U.S. PATENT DOCUMENTS

| | | | |
|---|---|---|---|
| 4,204,174 A | 5/1980 | King | |
| 4,609,881 A | 9/1986 | Wells | |
| 5,021,754 A | 6/1991 | Shepherd et al. | |
| 5,038,120 A | 8/1991 | Wheatley et al. | |
| 5,124,670 A | 6/1992 | Lawton | |
| 5,907,253 A * | 5/1999 | Davis et al. | 327/156 |
| 6,064,272 A * | 5/2000 | Rhee | 331/16 |
| 6,236,275 B1 * | 5/2001 | Dent | 331/1 A |
| 7,825,706 B2 * | 11/2010 | Smith et al. | 327/156 |
| 2006/0197562 A1 * | 9/2006 | Smith et al. | 327/156 |

* cited by examiner

*Primary Examiner* — Adam Houston
(74) *Attorney, Agent, or Firm* — Andrew S. Viger; Wade J. Brady, III; Frederick J. Telecky, Jr.

(57) ABSTRACT

A fractional spur compensation technique is implemented in a fractional-N PLL using multiple phase comparison frequencies $F_{pd}$, one of which is selected for any channel frequency $F_{ch}$ in a target frequency band to obtain a selected offset frequency $F_{os}$ between the channel frequency $F_{ch}$ and its primary fractional spur throughout the target frequency band. Other features of an exemplary implementation of the fractional spur compensation technique include (a) maintaining the phase comparison frequency at less than a predetermined maximum value, (b) using a programmable reference frequency multiplier with selectable multiplication factors and/or a programmable reference frequency divider with selectable divide ratios to generate multiple phase comparison frequencies derived from a predetermined reference frequency $F_{ref}$ and (c) using a programmable charge pump to select different charge pump currents for respective phase comparison frequencies to reduce loop gain variation.

19 Claims, 3 Drawing Sheets

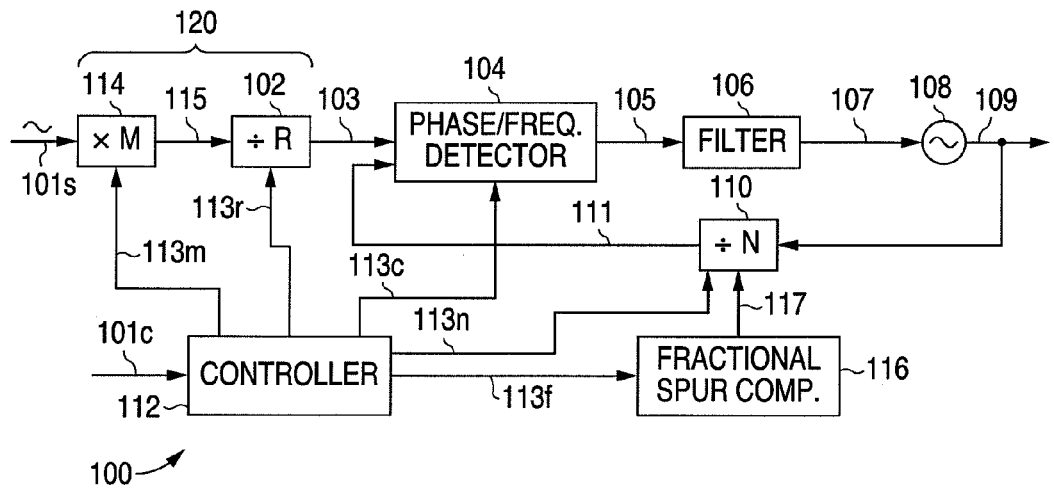
FIG. 1
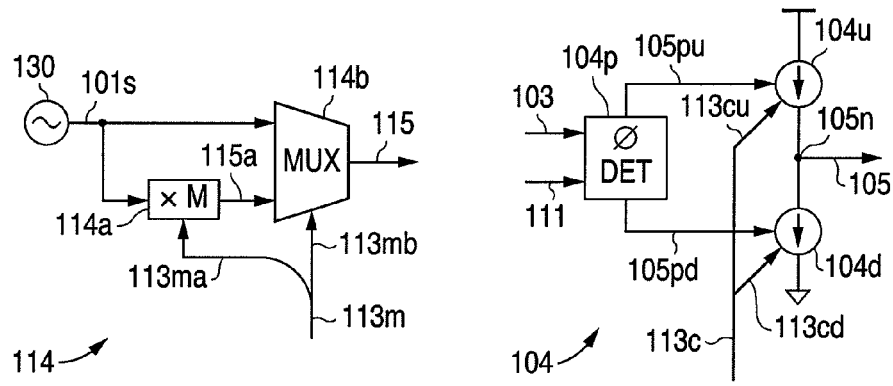
FIG. 2  FIG. 3
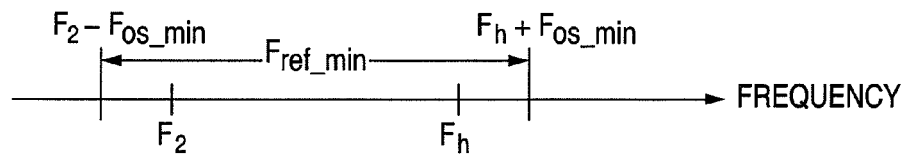
FIG. 4

| Sub-Band | Fref(MHz) | Fch(MHz) | R | Fpd(Mhz) | N | Den | Num | Fos(Fch,R) (MHz) |
|---|---|---|---|---|---|---|---|---|
|  | 104 | 2110 | 2 | 52 | 40 | 1040 | 600 | 22.00 |
| B0 | 104 | 2123.3 | 2 | 52 | 40 | 1040 | 866 | 8.70 |
|  | 104 | 2123.4 | 3 | 34.6667 | 61 | 1040 | 262 | 8.73 |
| B1 | 104 | 2140.6 | 3 | 34.6667 | 61 | 1040 | 778 | 8.73 |
|  | 104 | 2140.7 | 2 | 52 | 41 | 1040 | 174 | 8.70 |
| B2 | 104 | 2170 | 2 | 52 | 41 | 1040 | 760 | 14.00 |

FRACTIONAL-N PLL USING MULTIPLE PHASE COMPARISON FREQUENCIES TO IMPROVE SPURIOUS SIGNAL PERFORMANCE

RELATED APPLICATION DATA

This application is a non-provisional application based on and claiming priority from U.S. Provisional Patent Application No. 61/387,197, filed Sep. 28, 2010.

BACKGROUND

1. Field of the Invention

The present invention relates to fractional-N frequency synthesis, and more particularly to improving fractional spurious signal performance.

2. Related Art

The conventional analog integer-N PLL (phase locked loop) includes a VCO (voltage-controlled oscillator) locked to the desired output frequency Fout which is an integer multiple of a reference or phase comparison frequency Fout=N*Fcomp (where Fcomp may be derived from a reference oscillator frequency). VCO phase/frequency lock is established by a feedback control loop including a PD (phase detector, which may be implemented as a phase-frequency detector) and a feedback integer-N frequency divider—the PD compares Fcomp to the divided-down Fout/N, and provides phase/frequency control to the VCO. Thus, Fcomp determines the desired frequency resolution (also referred to as channel spacing or step size)—for each increment/decrement of N, Fout changes by Fcomp, and correspondingly the control loop will require a divide by N=Fout/Fcomp.

Frequency division is a source of phase noise (theoretically [20 log N]dB). Many applications for frequency synthesis require values of Fout and channel spacing Fcomp that require large values of N, such that the required divide-by-N control loop becomes a dominant source of phase noise.

A fractional-N PLL architecture reduces phase noise by significantly reducing the degree of frequency division required by the integer-N PLL—frequency synthesis resolution is a fractional portion of Fcomp, so that Fcomp can be greater than the channel spacing, thereby reducing the degree N of frequency division required by the control loop. For a given Fcomp and Fout, the reduction in N reduces in-band phase noise, and in addition allows increasing loop bandwidth to reduce lock time. The output frequency Fout is now Fout=(N+F)*Fcomp, where N+F comprises an integer part N and a fractional part F=Num/Den, and where Num (Numerator) and Den (Denominator) are integers.

Since digital dividers operate only with integer values, fractional division is implemented by switching between different integer divisors such that the average divisor value is equal to the loop divisor N+F. A problem with this divisor switching is that it introduces spurious sideband frequencies ("spurs" or "fractional spurs"), which must be filtered. When the offset frequency between Fout for a given channel and the primary spur is small, this spurious frequency will be less attenuated by PLL loop filter, and more sensitive to modulation nonlinearities.

Let $F_{os}(F_{ch})$ represent the offset frequency between a given channel frequency $F_{ch}$ (i.e., Fout) and its primary fractional spur. For a given phase comparison frequency input to the PD $F_{pd}$ (i.e. Fcomp), the offset frequency $F_{os}(F_{ch})$ is $$F_{os}(F_{ch}, F_{pd}) = \min(\text{mod}(F_{ch}, F_{pd}), F_{pd} - \text{mod}(F_{ch}, F_{pd})), \quad (1)$$

where the function $\min(x_0, x_1)$ is the smaller of $x_0$ and $x_1$, and $$\text{mod}(F_{ch}, F_{pd}) = F_{ch} - \text{INT}\left(\frac{F_{ch}}{F_{pd}}\right)F_{pd}. \quad (2)$$

where the function INT(x) is the integer portion of any number x. Thus, when channel frequencies are closer to an integer multiple of $F_{pd}$ (Fcomp), a smaller offset frequency $F_{os}$ results.

These close-in primary spurs may fail to meet the spur mask requirement or be large enough to seriously degrade the RMS phase error performance. Alternatively, if the loop bandwidth is narrowed to filter out these close-in spurs, phase noise contributed by the VCO will increase, increasing integrated RMS phase error (RMS phase noise plus spurs) and phase lock time.

For example, in high data rate wireless communication applications, such as 4G/LTE and WIMAX, fractional spurs can be a significant problem both in the transmitted signal causing excessive emission power in adjacent channels, and in the receiver resulting in the down-conversion of undesired noise to baseband.

BRIEF DESCRIPTION OF THE DRAWINGS

The Figures and the Detailed Description disclose exemplary embodiments that illustrate the principles and features of the invention.

FIG. 1 illustrates exemplary fractional-N PLL circuitry implementing fractional spur compensation using multiple phase comparison frequencies.

FIG. 2 illustrates exemplary programmable frequency multiplier circuitry.

FIG. 3 illustrates exemplary programmable charge pump circuitry.

FIG. 4 illustrates an offset frequency range in comparison to a target frequency band.

DETAILED DESCRIPTION

Figure 5A:
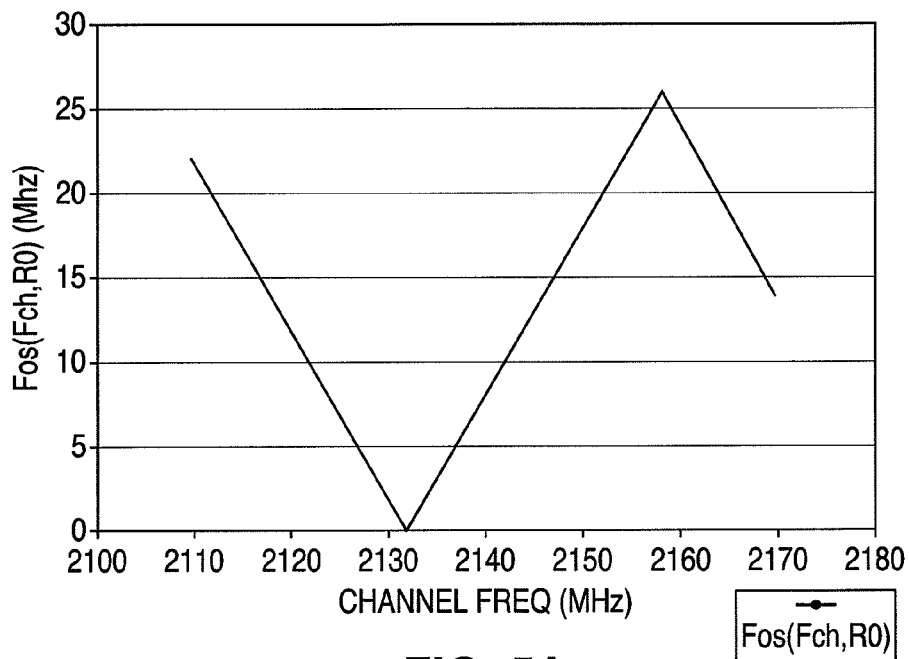
FIGS. 5A and 5B illustrate offset frequencies resulting from a conventional single reference or phase comparison frequency.

This Detailed Description, together with the Figures, discloses embodiments that illustrate the principles and features of the invention. However, the scope of the subject invention is defined by the Claims, and is not intended to be limited to the exemplary embodiments, and alternate embodiments based on the principles and features of the invention may be implemented without departing from the scope of the presently claimed invention. Known circuits, functions and operations are not described in detail to avoid unnecessarily obscuring the principles and features of the invention.

In a brief overview, a fractional spur compensation technique is implemented in a fractional-N PLL using multiple phase comparison frequencies $F_{pd}$, one of which is selected for any channel frequency $F_{ch}$ in a target frequency band to obtain a selected offset frequency $F_{os}$ between the channel frequency $F_{ch}$ and its primary fractional spur. The fractional spur compensation technique improves fractional spur performance by increasing the offset frequency $F_{os}$ between a selected channel frequency $F_{ch}$ and its primary fractional spur throughout the target frequency band. Other features of an exemplary implementation of the fractional spur compensation technique include (a) maintaining the phase comparison frequency at less than a predetermined maximum value in relation to the target frequency band, (b) using a programmable reference frequency multiplier with selectable multiplication factors and/or a programmable reference frequency divider with selectable divide ratios to generate multiple phase comparison frequencies derived from a predetermined reference frequency $F_{ref}$, and (c) using a programmable charge pump to select different charge pump currents for respective phase comparison frequencies to reduce loop gain variation.

Exemplary applications for the fractional spur compensation technique include improving fractional spur performance for any fractional-N PLL, including in combination with sigma delta compensation or other fractional spur compensation techniques, used in such applications as RF signal generation, local oscillators for radio transmitters/receivers, etc.

Referring to FIG. 1, an exemplary embodiment is implemented in a fractional-N PLL 100 that includes a programmable phase comparison signal generator 120, a phase (or phase/frequency) detector 104, a low pass loop filter 106 and a VCO 108. Phase comparison signal generator 120 provides a phase comparison signal 103 with multiple selectable phase comparison frequencies, derived from an input low noise input reference clock 101s. The input reference clock 101s can be generated using various signal sources, such as a crystal oscillator (XO), a temperature compensated XO (TCXO), a voltage-controlled XO (VCXO), or using outputs from a clock conditioner, or using an oscillator followed by a non-PLL frequency multiplier, or using an oscillator followed by PLL frequency multiplier.

For the exemplary embodiment, the phase comparison signal generator 120 is implemented with controllable reference frequency multiplier 114 and reference frequency divider 102, separately controllable or programmable to generate a selected phase comparison frequency based on selectable multiplication factors in combination with selectable divide ratios.

According to conventional fractional-N PLL frequency synthesis, VCO 108 outputs a PLL output signal 109 which is locked to a selected channel frequency by a VCO control loop, which includes a fractional-N frequency divider 110— for the exemplary embodiment, fractional-N division is implemented by the fractional-N frequency divider 110 in combination with a sigma delta modulator 116 to assist in fractional spur compensation. Phase detector 104 provides a phase comparison of the phase comparison signal 103 from the phase comparison signal generator 120 and a feedback fractional-N divided VCO control loop signal 111 from the fractional-N frequency divider 110, such that the channel frequency is established by the fractional division value and not the phase comparison frequency. The phase comparison output from phase detector 104 is filtered by the loop filter 106 and input as a VCO control signal 107 to VCO 108, which in response locks the PLL output signal 109 to the selected channel frequency (as established by the fractional-N division provided by the VCO control loop).

For the exemplary embodiment, a system controller 112 (such as an FPGA or microcontroller) provides control signals for controlling PLL parameters, including controlling the phase comparison frequency generator 120 to generate a selected phase comparison frequency using selected frequency multipliers and frequency divide ratios. The variable PLL parameters for different channel frequencies can be either calculated in real-time, or pre-calculated and stored. Respective control signals 113m and 113r are provided to the phase comparison frequency generator 120 to control respectively the reference frequency multiplication factor for frequency multiplier 114 and the divide ratio for the frequency divider 102. Control signals 113n and 113f are provided respectively to the fractional-N divider 110 and the sigma delta modulator 116—alternatively, the controller 112 can provide just the control signal 113f to the sigma delta modulator 116, which then provides a fractional-N division control signal 117 to the fractional-N divider 110. Additionally, a control signal 113c can be provided to program charge pump circuitry in the phase detector 104.

Referring to FIG. 2, an exemplary reference frequency multiplier 114 applies a selectable multiplication factor to the input reference clock 101s. For example, in some applications, the input reference clock 101s may provide an acceptably high frequency low noise reference signal so the frequency multiplier can be bypassed—for other applications, frequency multiplier 114 may be used to multiply the incoming input reference clock 101s to obtain a higher frequency reference signal 115. (A more detailed discussion of the minimum frequency of the multiplied signal 115 is provided below.) An exemplary implementation of reference frequency multiplier 114 includes a frequency multiplier 114a and a multiplexer 114b. Respective portions 113ma, 113mb of the multiplication control signal 113m program the multiplication factor M of the frequency multiplier 114a and signal selection by the multiplexer 114b.

Referring to FIG. 3, for the exemplary embodiment, the phase detector 104 includes a programmable charge pump for adjusting the PLL loop gain, thereby compensating for loop gain variations that would otherwise result from the use of multiple phase comparison frequencies. For example, if multiple divide ratios R are used to provide multiple phase comparison frequencies, then if the required divide ratios are 2 and 3 resulting in loop gain variation of 30-40 percent then charge pump adjustment to normalize loop gain may be advisable, while if the required divide ratios are 10 and 11 resulting in a loop gain difference of approximately 10 percent then charge pump adjustment may not be needed. Phase comparison circuitry 104p compares the phase of the phase comparison signal 103 and fractional-N divided VCO control loop signal 111, and provides charge pump-up 105pu and pump-down 105pd control signals. These control signals 105pu, 105pd drive controllable current sources 104u, 104d for sourcing current into or sinking current from the output node 105n to produce the phase detection signal 105. The respective source and sink currents available from these current sources 104u, 104d can be programmed in accordance with the control signal 113c from the controller 112 to enable different charge pump currents for different reference divide ratios of the programmable reference divider.

Referring to FIGS. 1 and 4, design considerations that illustrate aspects of the invention will now be described. First, regarding the minimum frequency of the clock multiplier output signal 115, assume a divide ratio of one for the programmable phase comparison signal generator 120, so that the frequency $F_{ref}$ of the signal 115 is equal to the frequency $F_{pd}$ of the phase comparison signal 103. For a target frequency band $[F_l, F_h]$, if $F_{os\_min}$ is specified (by design choice) to be the minimum spacing between the primary fractional spur and each channel frequency, then it can be assured that $F_{ref}$ and $F_{pd}$ should be sufficiently high so that the target frequency band $[F_l, F_h]$ is contained in the interval $(BF_{ref}, (B+1)F_{ref})$, thereby satisfying the conditions:

$$BF_{ref} \leq F_l - F_{os\_min} \quad (3)$$

$$F_h + F_{os\_min} \leq (B+1)F_{ref} \quad (4)$$

where B is an integer not less than 0. Conditions (3), (4) are equivalent to:

$$F_{ref} \geq F_h - F_l + 2F_{os\_min} \quad (5)$$

$$INT\left(\frac{F_l - F_{os\_min}}{F_{ref}}\right) = INT\left(\frac{F_h + F_{os\_min}}{F_{ref}}\right) \quad (6)$$

where the function INT(x) is the integer portion of any number x.

Referring to FIG. 4, condition (5) can be represented as a minimum range for the reference frequency $F_{ref\_min}$ (i.e., a minimum range for the phase comparison frequency which in the example is equal to $F_{ref}$). In addition, it is often advantageous to specify (by design choice) a maximum phase comparison frequency $F_{pd\_max}$, such that $F_{ref}$ (i.e., $F_{pd}$) is less than $F_{pd\_max}$ for every frequency in the target frequency band.

As a design example, if the target frequency band is [2110 MHz, 2170 MHz], and $F_{os\_min}$ is by design choice 1 MHz, then $[F_l - F_{os\_min}, F_h + F_{os\_min}] = [2109$ MHz, $2171$ MHz], and $[F_h - F_l + 2F_{os\_min} = 2170 - 2110 + 2*1 = 62$ MHz]. If $F_{ref} = 104$ MHz, then conditions (3) and (4) are met because the target frequency band is contained within the frequency band $[20*F_{ref}, 21*F_{ref}] = [2080$ Mhz, $2184$ MHz], and $F_{os}$ is greater than 1 MHz for all channels within the frequency band. Thus, in accordance with condition (5), $F_{ref}$ (104 MHz)$\geq F_h - F_l + 2F_{os\_min} \geq 62$ MHz).

Referring to FIG. 4, conditions (5) and (6) represent a minimum range for the reference frequency $F_{ref\_min}$ (i.e., a minimum range for the phase comparison frequency which in the example is equal to $F_{ref}$) to achieve required spacing $F_{os\_min}$ between the primary fractional spur and each channel frequency within the target frequency band $[F_l, F_h]$. It is well-known that a PLL can only operate with a phase comparison frequency less than its maximum allowed phase comparison frequency $F_{pd\_max}$. For instance, some PLL devices may specify its $F_{pd\_max}$ to be 100 MHz or less. If, however, $F_{ref}$ is greater than a specified maximum phase comparison frequency $F_{pd\_max}$, then $F_{ref}$ must be reduced, such as by applying a divisor R>1 to obtain a phase comparison frequency $$F_{pd} = \frac{F_{ref}}{R}$$

lower than $F_{pd\_max}$.

Figure 5B:
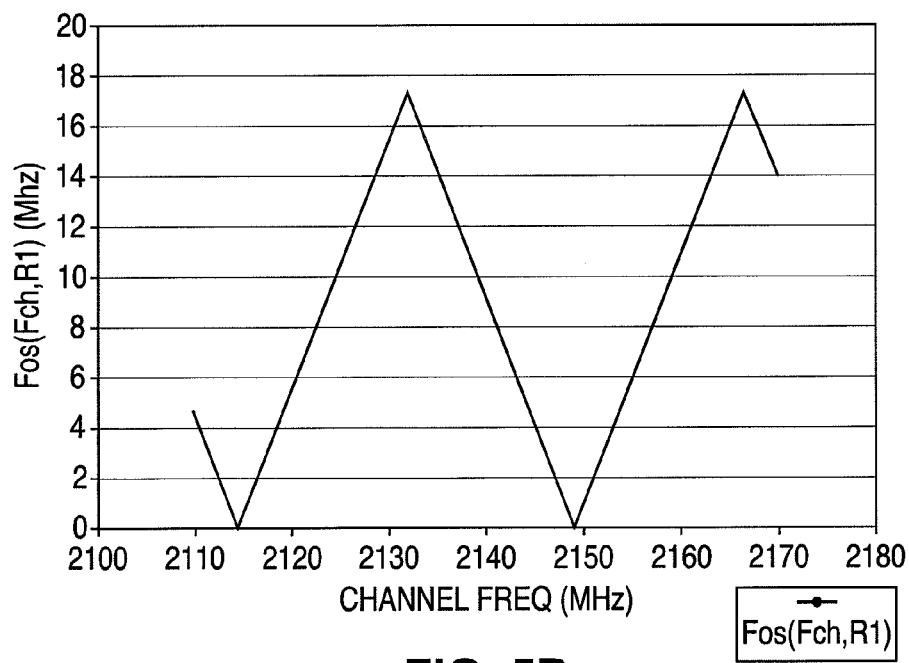

Continuing the design illustration and assuming $F_{pd\_max}=75$ Mhz, which is lower than $F_{ref}=104$ MHz, a divisor of R=2 or R=3 can be used to achieve $$F_{pd} = \frac{F_{ref}}{R}$$

lower than $F_{pd\_max}$. FIGS. 5A and 5B illustrate $F_{os}$ as a function of $F_{ch}$ for a different divisor R. For example, referring to FIG. 5A, if a divisor R=2 is applied to $F_{ref}=104$ MHz such that $F_{pd}$ is reduced to 52 MHz, since $41F_{pd}=2132$ MHz falls within the target frequency band $[F_l, F_h]$, $F_{os}$, the spacing between the carrier frequency and its fractional spur can be less than the required $F_{os\_min}$ for some channels. In particular, for channel frequencies such as $F_{ch}=2132.1$ Mhz or 2131.9 Mhz, $F_{os}$ is only 100 kHz, which is less than the required $F_{os\_min}$ of 1 Mhz. Referring to FIG. 5B, a similar issue occurs for a divisor of R=3.

In accordance with aspects of the invention, to address the issue discussed above, multiple phase comparison frequencies $F_{pd}$ obtained by dividing down a sufficiently high frequency signal 115 $F_{ref}$ using multiple divisor values are used such that, for any given channel frequency $F_{ch}$ within a target frequency band $[F_l, F_h]$, a selected one of the multiple phase comparison frequencies $$F_{pd} = \frac{F_{ref}}{R}$$

is used to achieve an acceptable $F_{os}$, including satisfying the condition that each phase comparison frequency $F_{pd}$ is less than a specified $F_{pd\_max}$. Referring to FIG. 1, phase comparison signal generator 120 is controlled to implement selected using selected frequency multipliers and/or frequency divide ratios for a given (by design choice) reference frequency $F_{ref}$ (signal 101s).

Referring to FIGS. 5A/5B and 6, the selection of the phase comparison frequencies $F_{pd}$ is a design choice consistent with the principles of the invention. For an illustrative design example, assume that the phase comparison frequencies $F_{pd}$ are controlled by the selection of multiple divide ratios R (that is, ignoring the use of multiple multiplication factors alone or in combination with one or more divide ratios). If two integer numbers $R_0$, $R_1$ are used as the reference divide ratios, for a given channel frequency $F_{ch}$, the function $F_{os}(F_{ch}, F_{pd})$ as defined by Equation (1) in the Background can be used to choose either $R_0$ or $R_1$ as follows: (a) if $$F_{os}\left(F_{ch}, \frac{F_{ref}}{R_0}\right)$$

is not less than $$F_{os}\left(F_{ch}, \frac{F_{ref}}{R_1}\right),$$

then program $R_0$ to the programmable phase comparison signal generator (120 in FIG. 1); otherwise (b) program $R_1$ to the divider.

Using this technique, the lower bound of $F_{os}(F_{ch})$ for the target frequency band $[F_l, F_h]$ is related to $F_{ref}$, $R_0$, and $R_1$. If $R_0$ and $R_1$ are selected such that:

$$\frac{F_{ref} GCF(R_0, R_1)}{2R_0 R_1} \geq F_{os\_min}, \quad (7)$$

where $GCF(R_0, R_1)$ is the greatest common factor of $R_0$ and $R_1$, then for any channel frequency $F_{ch}$, within the target frequency band $[F_l, F_h]$, $$F_{os}(F_{ch}) \geq F_{os\_min} \quad (8)$$

Continuing the design illustration, for most applications, $R_0$ and $R_1$ can be selected as consecutive integers R and R+1 greater than 1, so that R, R+1 are co-prime, i.e., GCF(R,R+

1)=1. Hence the upper bound for R can be determined from Eq. (7) by solving the following:

$$R^2 + R = \frac{F_{ref}}{2F_{os\_min}} \quad (9)$$

which can be solved for R:

$$R \leq \sqrt{\frac{F_{ref}}{2F_{os\_min}} + \frac{1}{4}} - \frac{1}{2} \quad (10)$$

Alternatively, R can be determined during programming by predefining $R_0$ and $R_1$ so that either $$F_{os}\left(F_{ch}, \frac{F_{ref}}{R_0}\right) \text{ or } F_{os}\left(F_{ch}, \frac{F_{ref}}{R_1}\right)$$

is larger than $F_{os\_min}$. For this case, the divide ratio R can be determined as follows: (a) if $$F_{os}\left(F_{ch}, \frac{F_{ref}}{R_0}\right)$$

is not less than $F_{os\_min}$, then program $R_0$ to the phase comparison signal generator (120 in FIG. 1); otherwise (b) program $R_1$ to divider.

Continuing the design illustration, a selected target frequency band is $[F_l,F_h]$=[2110 MHz, 2170 MHz], a selected frequency synthesis resolution (channel spacing or step size) is 100 kHz, and a selected $F_{os\_min}$ is 5 Mhz. If $F_{ref}$ is selected to be 104 MHz, then the target frequency band [2110 MHz, 2170 MHz] is contained in the interval $(BF_{ref},(B+1)F_{ref})$ where B=20, or [20*104, 21*104]=[2080 MHz, 2184 MHz], thereby satisfying the conditions (3) and (4) above. That is, $[F_l]$2110−2080 MHz and $[F_h]$ 2184−2170 are both greater than $F_{os\_min}$=5 Mhz.

Figures 6, 7:
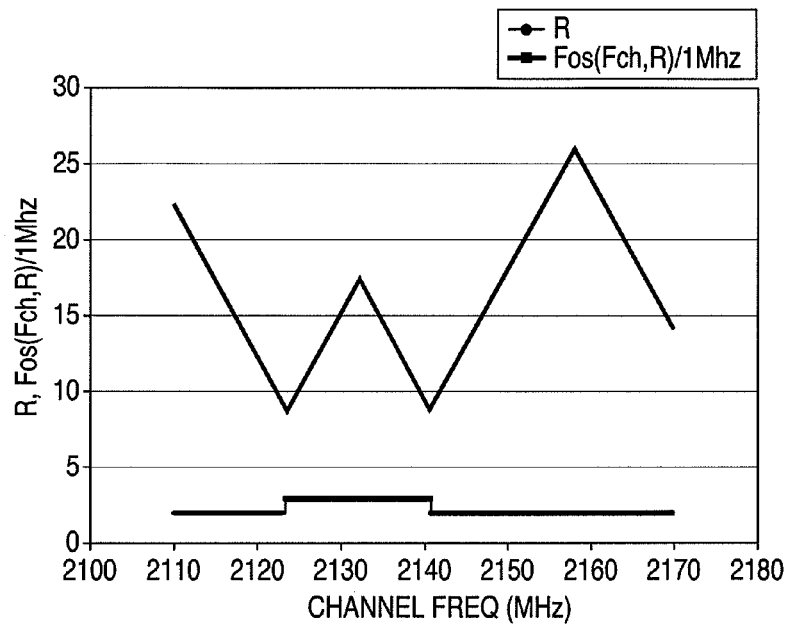
FIG. 6 illustrates an exemplary implementation in which offset frequencies resulting from multiple phase comparison frequencies are obtained by using multiple reference divisors.
FIG. 7 is a table of exemplary PLL programming parameters for fractional-N PLL circuitry.

Referring to FIG. 6, if $R_0$=2 and $R_1$=3, then $F_{os}(F_{ch})$ is greater than $$\frac{F_{ref}GCF(R_0, R_1)}{2R_0R_1} = \frac{104 \text{ Mhz}}{2*3*2} = 8.67 \text{ Mhz} > 5 \text{ Mhz},$$

with the resulting $F_{os}(F_{ch})$ as a function of $F_{ch}$ for the target frequency band as shown. It can be seen that the smallest $F_{os}(F_{ch})$ for the whole frequency band is 8.70 Mhz, which is greater than the estimated lower bound 8.67 Mhz.

By comparison, referring to FIGS. 5A and 5B, the resulting $F_{os}(F_{ch})$ as a function of $F_{ch}$ for the target frequency band using a constant R, either R=2 or R=3, the worst case $F_{os}(F_{ch})$ for the whole frequency band is 100 kHz, which is less than the design requirement.

An affect of using different phase comparison frequencies is that PLL loop gains are different for different reference divide ratios. For some applications, a substantially uniform loop gain is desirable. In accordance with aspects of the invention, as discussed above in connection with FIG. 3, an exemplary embodiment of the invention includes a programmable charge pump. If two divisors $R_0$, $R_1$ are to be used, $I_{cp0}$ and $I_{cp1}$ denote the corresponding charge pump currents for $R_0$ and $R_1$, respectively. Variation in the PLL loop gain caused by these different reference divide ratios can be eliminated if $R_1$, $I_{cp0}$ and $I_{cp1}$ satisfy the following condition:

$$\frac{I_{cp0}}{R_0} = \frac{I_{cp1}}{R_1} \quad (16)$$

For example, if $R_0$=2, $R_1$=3, and $I_{cp0}$=2 mA, then $I_{cp1}$ can be calculated to be $$I_{cp1} = \frac{R_1 I_{cp0}}{R_0} = \frac{3 \times 2 \text{ mA}}{2} = 3 \text{ mA}.$$

As stated previously, the variable PLL parameters R, $I_{cp}$, N, Num, Den for the target frequency band can be calculated in real-time, or be pre-calculated and then stored for use during operation.

For a given channel frequency $F_{ch}$, after the reference divide ratio R is determined in accordance with aspects of the invention, the fractional-N divider/counter parameters can be conventionally determined to achieve the target frequency based on the following:

$$F_{ch} = \frac{Fref}{R}\left(N + \frac{Num}{Den}\right) \quad (12)$$

where N is the integer portion of divide ratio, Num is the fractional numerator, and Den is the fractional denominator.

If the required frequency synthesis resolution is $F_{ch}$=$F_{stepsize}$, then the fractional denominator Den can be determined by $$Den = \frac{F_{ref}}{F_{stepsize}}C, \quad (13)$$

where C>0 is any suitable positive integer. For different reference divide ratios (that is, different phase comparison frequencies), either a common denominator or different denominators can be used, although a common denominator is preferred for its simplicity. For example, if $F_{ref}$=104 Mhz, $F_{stepsize}$=0.1 Mhz and C=1, then Den=104/0.1=1040 can be used.

The integer N and numerator Num portions can be determined as follows:

$$N = INT\left(\frac{F_{ch}}{Fref}R\right) \quad (14)$$

$$Num = \left(\frac{F_{ch}}{Fref}R - N\right) * Den \quad (15)$$

Referring to FIG. 7, continuing the design illustration, the requisite amount of memory can be controlled/minimized. For the example above, the PLL fractional-N counter parameters for the target frequency band are as shown. The target frequency band is divided into three sub-bands: B0, B1 and B2. The reference divisor is R=2 for sub-bands B0 and B2, and R=3 for sub-band B1. The fractional denominator is a constant Den=1040. The fractional denominator and integer N may vary for different channels. Since either R0 or R1 is to be used, only one bit per channel frequency is sufficient for determining the R value or charge pump current (ICP) value. To further reduce required memory, parameters such as R, ICP, N, Num for the start channel frequency and the end channel frequency of each sub-band can be stored in memory and simple calculations can be used during real-time programming to determine the proper programming values for any target channel frequency.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including fractional-N phase-locked loop (PLL) circuitry, comprising:
    programmable phase comparison signal generator circuitry responsive to one or more reference control signals and a reference signal having a reference frequency $F_{ref}$ by providing a comparison signal having a programmable comparison frequency $F_{pd}$;
    phase detector circuitry coupled to said programmable comparison signal generator circuitry and responsive to said comparison signal and a feedback signal by providing a phase detection signal;
    controllable oscillator circuitry coupled to said phase detector circuitry and responsive to said phase detection signal by providing a PLL output signal having one $F_{ch}$ of a plurality of output frequencies each of which is equal to a multiple of said comparison frequency; and
    programmable feedback frequency divider circuitry coupled to said controllable oscillator circuitry and said phase detector circuitry, and responsive to said PLL output signal and one or more feedback control signals by providing said feedback signal;
    wherein
        said plurality of output frequencies is bounded by minimum $F_l$ and maximum $F_h$ output frequencies in relation to said one or more feedback control signals,
        a predetermined minimum offset frequency $F_{os\_min}$ is defined in relation to a difference between each of said plurality of output frequencies and a respective one of a plurality of primary fractional spurious signal frequencies, and
        said reference frequency $F_{ref}$ is greater than or equal to a sum of
            a difference $F_h - F_l$ between said maximum and minimum output frequencies, and double said minimum offset frequency $2F_{os\_min}$.

2. The apparatus of claim 1, wherein said programmable comparison signal generator circuitry comprises programmable frequency divider circuitry, wherein a quotient of said reference and programmable comparison frequencies equals one of a plurality of integers in relation to said one or more reference control signals.

3. The apparatus of claim 2, wherein said plurality of integers comprises a plurality of consecutive integers.

4. The apparatus of claim 1, wherein said programmable comparison signal generator circuitry comprises:
    programmable frequency multiplier circuitry responsive to at least a first portion of said one or more reference control signals and said reference signal by providing an intermediate signal having an intermediate frequency equal to an integer multiple of said reference frequency, wherein a ratio M of said intermediate and reference frequencies equals one of a plurality of integers greater than or equal to unity in relation to said at least a first portion of said one or more reference control signals; and
    programmable frequency divider circuitry coupled to said programmable frequency multiplier circuitry and responsive to at least a second portion of said one or more reference control signals and said intermediate signal by providing said comparison signal, wherein a quotient R of said intermediate and programmable comparison frequencies equals one of another plurality of integers in relation to said at least a second portion of said one or more reference control signals.

5. The apparatus of claim 1, wherein said phase detector circuitry is further responsive to one or more gain control signals by providing said phase detection signal such that a ratio of said phase detection signal and said programmable comparison frequency is defined by a gain factor in relation to said one or more gain control signals.

6. The apparatus of claim 1, wherein said controllable oscillator circuitry comprises voltage-controlled oscillator (VCO) circuitry.

7. The apparatus of claim 1, wherein said programmable feedback frequency divider circuitry comprises fractional-N frequency divider circuitry responsive to said PLL output signal and one or more feedback control signals by providing said feedback signal.

8. The apparatus of claim 1, wherein said programmable feedback frequency divider circuitry comprises:
    fractional spur compensation circuitry responsive to said one or more feedback control signals by providing one or more frequency division control signals; and
    fractional-N frequency divider circuitry coupled to said fractional spur compensation circuitry and responsive to said PLL output signal and said one or more frequency division control signals by providing said feedback signal.

9. The apparatus of claim 1, wherein said comparison frequency $F_{pd}$ is less than a predetermined maximum value $F_{pd\_max}$ in relation to said one or more reference control signals.

10. The apparatus of claim 9, wherein said predetermined maximum comparison frequency value $F_{pd\_max}$ is defined in relation to said one or more reference control signals.

11. An apparatus including phase-locked loop (PLL) circuitry, comprising:
    programmable comparison signal generator means for receiving one or more reference control signals and a reference signal having a reference frequency $F_{ref}$ and in response thereto providing a comparison signal having a programmable comparison frequency $F_{pd}$;
    phase detector means for receiving said comparison signal and a feedback signal and in response thereto providing a phase detection signal;
    controllable oscillator means for receiving said phase detection signal and in response thereto providing a PLL output signal having one $F_{ch}$ of a plurality of output frequencies each of which is equal to a multiple of said comparison frequency; and
    programmable feedback frequency divider means for receiving said PLL output signal and one or more feedback control signals and in response thereto providing said feedback signal;

wherein
said plurality of output frequencies is bounded by minimum $F_l$ and maximum $F_h$ output frequencies in relation to said one or more feedback control signals,
a predetermined minimum offset frequency $F_{os\_min}$ is defined in relation to a difference between each of said plurality of output frequencies and a respective one of a plurality of primary fractional spurious signal frequencies, and
said reference frequency is greater than or equal to a sum of
a difference $F_h - F_l$ between said maximum and minimum output frequencies, and double said minimum offset frequency $2F_{os\_min}$.

12. A method for providing a phase-locked signal, comprising:
receiving one or more reference control signals and a reference signal having a reference frequency $F_{ref}$ and in response thereto providing a comparison signal having a programmable comparison frequency $F_{pd}$;
receiving said comparison signal and a feedback signal and in response thereto providing a phase detection signal;
receiving said phase detection signal and in response thereto providing a PLL output signal having one $F_{ch}$ of a plurality of output frequencies each of which is equal to a multiple of said comparison frequency; and
receiving said PLL output signal and one or more feedback control signals and in response thereto providing said feedback signal;
wherein
said plurality of output frequencies is bounded by minimum $F_l$ and maximum $F_h$ output frequencies in relation to said one or more feedback control signals,
a predetermined minimum offset frequency $F_{os\_min}$ is defined in relation to a difference between each of said plurality of output frequencies and a respective one of a plurality of primary fractional spurious signal frequencies, and
said reference frequency is greater than or equal to a sum of
a difference $F_h - F_l$ between said maximum and minimum output frequencies, and double said minimum offset frequency $2F_{os\_min}$.

13. The method of claim 12, wherein a quotient of said reference and programmable comparison frequencies equals one of a plurality of integers in relation to said one or more reference control signals.

14. The method of claim 13, wherein said plurality of integers comprises a plurality of consecutive integers.

15. The method of claim 12, wherein said receiving said comparison signal and a feedback signal having a feedback frequency $F_{fb}$ and in response thereto providing a phase detection signal comprises:
receiving at least a first portion of said one or more reference control signals and said reference signal and in response thereto providing an intermediate signal having an intermediate frequency equal to an integer multiple of said reference frequency, wherein a ratio M of said intermediate and reference frequencies equals one of a plurality of integers greater than or equal to unity in relation to said at least a first portion of said one or more reference control signals; and
receiving at least a second portion of said one or more reference control signals and said intermediate signal and in response thereto providing said programmable comparison signal, wherein a quotient R of said intermediate and comparison frequencies equals one of another plurality of integers in relation to said at least a second portion of said one or more reference control signals.

16. The method of claim 12, further comprising receiving one or more gain control signals and in response thereto providing said phase detection signal such that a ratio of said phase detection signal and said programmable comparison frequency is defined by a gain factor in relation to said one or more gain control signals.

17. The method of claim 12, wherein said receiving said PLL output signal and one or more feedback control signals and in response thereto providing said feedback signal comprises:
receiving said one or more feedback control signals and in response thereto providing one or more fractional spur compensation control signals; and
receiving said PLL output signal and said one or more fractional spur compensation control signals and in response thereto providing a fractional-N frequency divided signal as said feedback signal.

18. The method of claim 12, wherein said comparison frequency $F_{pd}$ is less than a predetermined maximum value $F_{pd\_max}$ in relation to said one or more reference control signals.

19. The method of claim 18, wherein said predetermined maximum comparison frequency value $F_{pd\_max}$ is defined in relation to said one or more feedback control signals.

* * * * *